(12) United States Patent
Saini et al.

(10) Patent No.: US 6,600,847 B2
(45) Date of Patent: Jul. 29, 2003

(54) SEMICONDUCTOR OPTICAL DEVICE WITH IMPROVED EFFICIENCY AND OUTPUT BEAM CHARACTERISTICS

(75) Inventors: Simarjeet Saini, Columbia, MD (US); Peter J. S. Heim, Washington, DC (US)

(73) Assignee: Quantum Photonics, Inc, Jessup, MD (US)

( * ) Notice: Subject to any disclaimer, the term of this patent is extended or adjusted under 35 U.S.C. 154(b) by 0 days.

(21) Appl. No.: 09/985,499

(22) Filed: Nov. 5, 2001

(65) Prior Publication Data

US 2003/0086654 A1 May 8, 2003

(51) Int. Cl.[7] .............................. G02B 6/12; H01S 5/026
(52) U.S. Cl. .............................. 385/14; 385/43; 385/27; 385/129; 385/130; 385/131; 385/50; 372/43; 372/50
(58) Field of Search .......................... 385/14, 129, 130, 385/131, 132, 43, 50, 27, 28; 372/43, 50

(56) References Cited

U.S. PATENT DOCUMENTS

| | | | | |
|---|---|---|---|---|
| 4,594,719 A | | 6/1986 | Ackley | 372/50 |
| 4,624,000 A | * | 11/1986 | Streifer et al. | 372/45 |
| 5,444,730 A | * | 8/1995 | Mizutani | 372/45 |
| 5,799,024 A | * | 8/1998 | Bowers et al. | 372/11 |
| 5,802,084 A | * | 9/1998 | Bowers et al. | 372/18 |
| 6,293,688 B1 | * | 9/2001 | Deacon | 362/556 |
| 6,310,995 B1 | | 10/2001 | Saini et al. | 385/28 |
| 6,330,378 B1 | * | 12/2001 | Forrest et al. | 385/14 |
| 6,483,863 B2 | * | 11/2002 | Forrest et al. | 372/50 |

* cited by examiner

Primary Examiner—Brian Healy
(74) Attorney, Agent, or Firm—Foley & Lardner (57) ABSTRACT

An optical device is provided comprising a gain section adapted to emit radiation at a radiation wavelength, a coupling section adjacent to the gain section for transitioning radiation between an active waveguide and a passive waveguide, and a passive section adjacent to the coupling section supporting a single-lobed optical mode in the passive waveguide at the radiation wavelength. The passive waveguide has an index of refraction and dimension such that the confinement of the radiation within the active waveguide in the gain section is reduced.

35 Claims, 8 Drawing Sheets

SEMICONDUCTOR OPTICAL DEVICE WITH IMPROVED EFFICIENCY AND OUTPUT BEAM CHARACTERISTICS

BACKGROUND OF THE INVENTION

A. Field of the Invention

The invention relates generally to light emitting devices, more particularly, to semiconductor optical lasers having an improved design to reduce internal optical loss.

B. Description of the Related Art

Semiconductor lasers are attractive sources for optical power generation because they are more efficient, smaller, and less expensive than other types of lasers. There are increasing applications for higher output power single-spatial-mode semiconductor lasers such as for pumping optical fiber amplifiers/lasers, optical wireless communications, optical fiber transmitters, and other laser applications. The output optical power from a semiconductor laser (P) is governed by a simple relationship: $P=S \times (I-I_{th})$. As the current (I) injected into the semiconductor laser is increased above the threshold current value ($I_{th}$), the output power increases proportionally with a constant of proportionality S known as the slope efficiency. High power semiconductor lasers are operated at current injection levels high above threshold. Therefore, the slope efficiency is the most dominant parameter determining the attainable maximum output power. It is at least partially for this reason that increasing the slope efficiency is critical for increasing the output power of semiconductor lasers. An additional benefit of increased slope efficiency is an increase in the net electrical-to-optical conversion efficiency which reduces power consumption and heat generation. However, for single-mode applications, such as coupling light into optical fibers, it is crucial that the angular intensity profile of the optical radiation emitted by the semiconductor laser remain nearly diffraction limited. This requires that the optical mode at the laser output facet must be single-lobed and preferably have an intensity profile that is substantially gaussian. Therefore, increasing the slope efficiency of a single-mode laser is most beneficial if the optical mode at the output facet retains a single-lobed intensity profile.

The slope efficiency is directly influenced by the background optical loss that the optical mode experiences inside the semiconductor laser. A lower internal optical loss results in a higher slope efficiency. For conventional semiconductor lasers, more than 50% of the lasing mode is propagating in the doped cladding region, where the optical loss due to free-carrier absorption is significant. This loss is particularly large for the p-side cladding. The internal loss can be reduced by using broadened waveguide structures as described in Electron. Lett., vol. 32, pp. 1717–1719, 1996. However, a broadened waveguide may cause adverse effects as well. The increased carrier transport time in the broadened guiding layer will increase the population of carriers in the guiding layers and enhance the carrier recombination. Consequently, the temperature sensitivity of the slope efficiency is deteriorated at high temperatures. The modulation bandwidth will also be degraded for broadened waveguide lasers since the carrier transit time is increased.

Higher slope efficiency and reduced internal loss can also be achieved by using low doping concentrations in the cladding layer as suggested by J. W. Pan, et. al. at the $10^{th}$ Int. Conf. on Molecular Beam Epitaxy, Cannes, France, 1998. However, electron leakage current over the low doped cladding layer has been found to become significant with temperature, and render threshold current and slope efficiency highly temperature sensitive.

Another approach to reduce the internal loss employs an asymmetric transversal layer design to reduce the confinement factor of the optical mode in the active region [IEEE Photon. Technol. Letters, vol. 11, no. 2, pp. 161–163, Feb. 1999]. The confinement factor is the ratio of the portion of optical mode that overlaps with the active region to the entire optical mode. This device uses an "optical trap" layer on the n-side of the active region to lower the confinement factor. A fundamental disadvantage of this approach, however, is that the transverse optical mode is no longer a single lobed gaussian shape. Instead, it has two distinct lobes. Thus the far field emission pattern from the laser is no longer diffraction limited. This distortion of the far field pattern significantly degrades device performance including reduced coupling efficiency of the laser to a single mode fiber.

SUMMARY OF THE INVENTION

The present invention is directed to overcoming or at least reducing the effects of one or more of the problems set forth above and other problems with the prior art.

According to one aspect of the present invention, an optical device is provided comprising a gain section adapted to emit radiation at a radiation wavelength, a coupling section adjacent to the gain section for transitioning radiation between an active waveguide and a passive waveguide, and a passive section adjacent to the coupling section supporting a single-lobed optical mode in the passive waveguide at the radiation wavelength. The passive waveguide has an index of refraction and dimension such that the confinement of the radiation within the active waveguide in the gain section is reduced.

According to another aspect of the present invention, a method of generating optical radiation is provided comprising the steps of generating a multi-lobed lasing mode in a gain section, one lobe of the lasing mode being substantially in an active waveguide in the gain section, and coupling the multi-lobed lasing mode to a single lobed optical mode substantially in a passive waveguide. The passive waveguide has an index of refraction and dimension such that the confinement of the multi-lobed lasing mode within the active waveguide in the gain section is reduced. Preferably, the passive waveguide has an index of refraction and dimension such that the passive waveguide supports a single lobed optical mode in the passive section. More preferably, the passive waveguide has an index of refraction and dimension such that the single lobed optical mode is a substantially diffraction-limited gaussian mode.

According to another aspect of the present invention, an optical device is provided comprising a gain section adapted to emit radiation at a radiation wavelength within an active waveguide, the gain section adapted for supporting a multi-lobed optical mode comprising a first and second lobe at the radiation wavelength, a coupling section adjacent to the gain section for transitioning the radiation from the active waveguide to an n-doped passive waveguide, and a passive section adjacent to the coupling section for supporting a single-lobed optical mode in the n-doped passive waveguide. The passive waveguide has an index of refraction and dimension such that confinement of the multi-lobed optical mode at the radiation wavelength within the active waveguide in the gain section is reduced. The peak intensity of the first lobe in the gain section occurs within the active waveguide and the peak intensity of the second lobe in the gain section occurs within the passive waveguide.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Reference will now be made in detail to presently preferred embodiments of the invention. Wherever possible, the same reference numbers will be used throughout the drawings to refer to the same or like parts.

Figure 1:
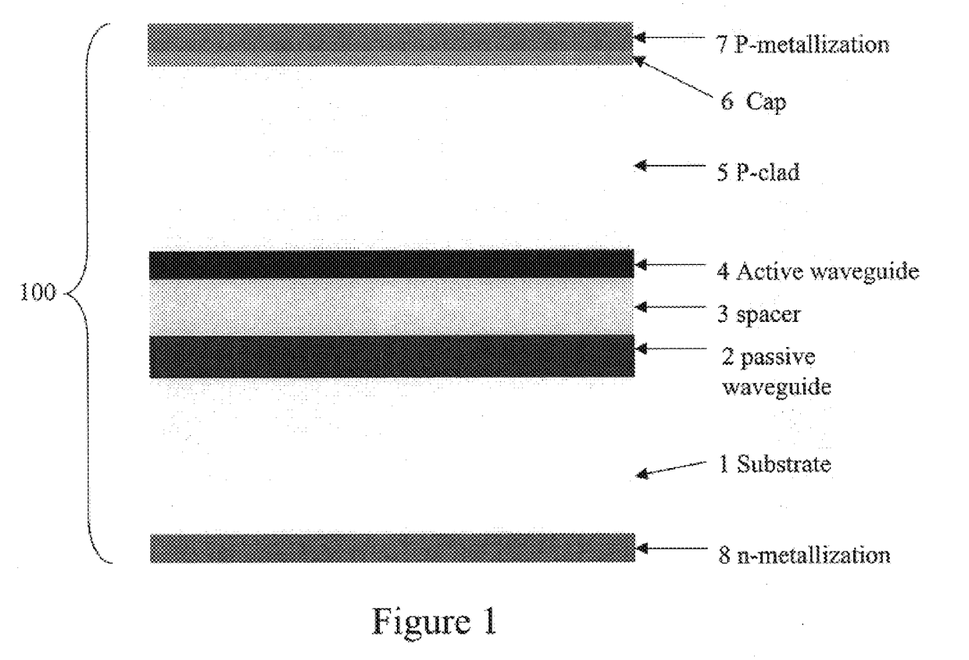
FIG. 1 is a cross-sectional view of a semiconductor laser according to an embodiment of the present invention.
Figure 2:
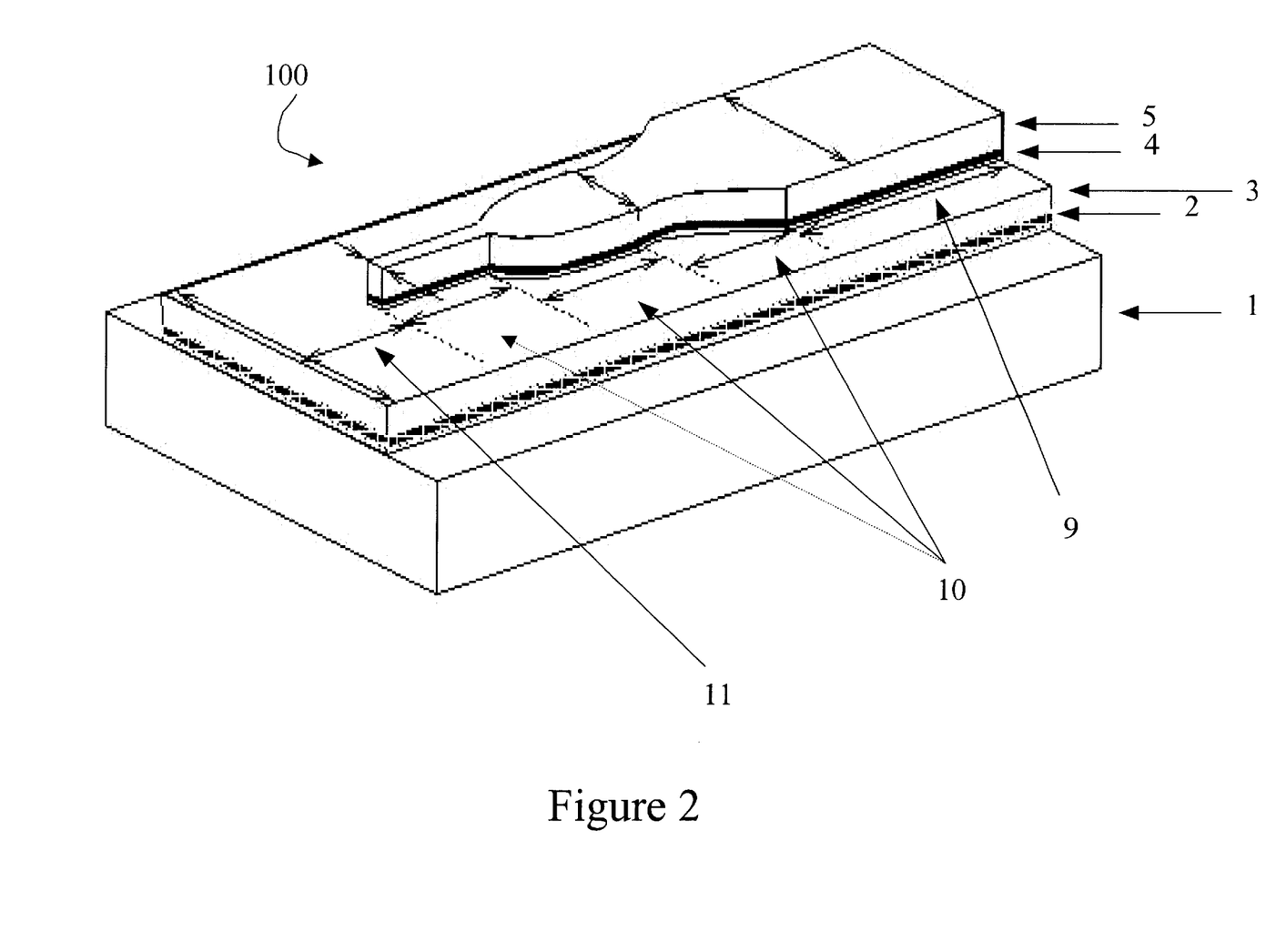
FIG. 2 is a perspective view of a semiconductor laser according to an embodiment of the present invention.

A semiconductor laser 100 according to a first embodiment of the present invention is shown in the cross-sectional view of FIG. 1, and the perspective view of FIG. 2. By way of example, other optical devices according to the present invention may include light emitting diodes (LED), semiconductor optical amplifiers, and other optical devices as would be readily apparent to one skilled in the art.

In this first embodiment, the semiconductor laser 100 comprises a gain section 9, a coupling section 10, and a passive section 11 which each may include multiple layers. These layers include a passive waveguide 2 and an active waveguide 4 separated by a spacer layer 3. Preferably, the passive waveguide 2 spans the length of the laser 100. As will be described later, the active waveguide 4 preferably spans at least the length of the coupling section 10 and the gain section 9, but may be omitted in the passive section 11. The coupling section 10 may be lengthened to include a section (as indicated by the dashed line in FIG. 2) that improves the fabrication tolerances. It should be appreciated that this section indicated by the dashed line is thus not required for functionality, but is provided for improved manufacturing of the device. The laser 100 further includes a substrate layer 1 and a bottom metallization layer 8 parallel to the passive waveguide 2 on a side opposite the active waveguide 4. Also, the laser 100 includes a cladding layer 5, a cap layer 6, and a top metallization layer 7 positioned parallel to the active waveguide 4 on a side opposite the passive waveguide 2.

The function of these layers will now be described in reference to FIG. 1 and FIG. 2. Top metallization layer 7 is used at least partially to provide a low resistance metal contact for applying a current to the gain section 9 of the laser 100. For example, top metallization layer 7 may comprise layered Ti/Pt/Au or Cr/Au. Similarly, bottom metallization layer 8 is also used at least partially to provide a low resistance metal contact for applying a current to the gain section 9 of the laser 100. For example, metallization layer 8 may comprise layered Ge/Au or Ni/Au/Ge/Ni/Au. Gain section 9 is pumped with current by applying a voltage between metallization layers 7 and 8, thereby providing the gain required for lasing. Capping layer 6 is preferably heavily doped with a p-type material, and is used to assist in forming an ohmic contact to the top metal contact layer 7.

Cladding layer 5 is configured so as to confine the optical mode within the active waveguide and to separate the top metallization layer 7, having relatively high optical absorption losses, from the active waveguide 4. The cladding layer 5 typically has an optical absorption greater than an optical absorption of the passive waveguide 2, spacer layer 3, and substrate 1 at the radiation wavelength because the cladding layer 5 preferably comprises a p-type material. Cladding layer 5 is provided parallel to active waveguide 4 on a side opposite to the passive waveguide 2.

Spacer layer 3 is configured so as to confine the optical mode in the passive section 11 to the passive waveguide 2. The spacer layer 3 is configured with an index of refraction lower than the index of refraction of the passive waveguide 2 or the index of refraction of the active waveguide 4, thereby acting as a cladding layer for the passive section 11. Preferably, the spacer layer 3 spans the length of the laser 100.

Laser efficiency may be improved by reducing internal losses due to absorption, i.e. internal absorption loss, of the optical mode within the laser 100 itself. Internal absorption loss is typically greater in the active waveguide 4 and cladding region 5 than in the passive waveguide 2, because the active waveguide 4 and cladding region 5 typically have a higher absorption loss at the laser emission wavelength than the passive waveguide 2. The larger loss in the active waveguide 4 and cladding region 5 is due, in part, to the significant free-carrier absorption in the active waveguide 4 and cladding region 5. To reduce the internal absorption loss in the laser 100, the laser 100 is configured such that confinement of a first optical mode at the radiation wavelength (the emission wavelength for a laser) within the active waveguide 4 is reduced, thereby shifting some of the first optical mode into the passive waveguide 2. As would be readily apparent to one skilled in the art, the term "confinement" and "confinement factor" are used synonymously.

Passive waveguide 2 is configured to reduce the confinement in the gain section 9 and also to support a single-lobed mode in the passive section 11 of the device. Absorption in the passive waveguide 2 may be reduced by careful selection of materials with a larger bandgap than a material of the active waveguide 4. In a preferred first embodiment, the first material may be an n-type material with a lower optical absorption at the radiation wavelength than the gain section 9, such as n-doped $Ga_xIn_{(1-x)}As_yP_{(1-y)}$ or $Al_yGa_xIn_{(1-x-y)}As$. The internal loss in the laser 100 is reduced because some of the first mode propagates in the passive waveguide, which has a lower absorption at the radiation wavelength of interest. Active waveguide 4 is configured to generate radiation in the gain section of the device. A preferred material for the active waveguide 4 is $Ga_xIn_{(1-x)}As_yP_{(1-y)}$ or $Al_yGa_xIn_{(1-x-y)}As$. The particular material may be altered to promote radiation at a specific desired radiation wavelength.

Figure 3:
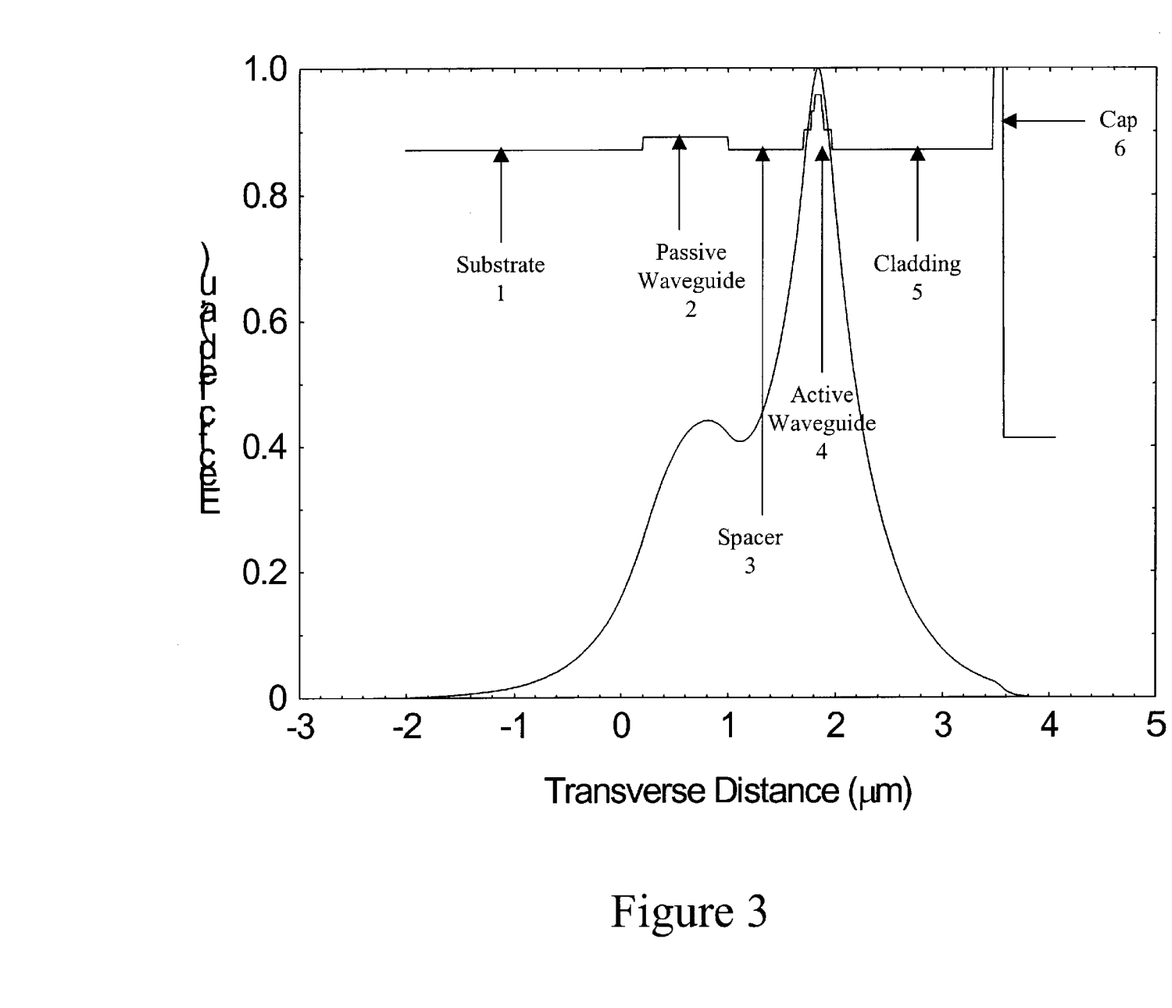
FIG. 3 is a graph of Electric Field v. Transverse Distance in a gain section of a semiconductor laser according to an embodiment of the present invention.

Adjusting the materials to reduce internal absorption loss and reducing confinement within the active waveguide 4, however, may result in a multi-lobed optical mode which is not a desirable output mode in many laser implementations. As shown by the graph of FIG. 3, the optical mode in the gain section typically includes a first lobe and a second lobe at least partially attributable to the reduced confinement in the active waveguide 4. A multi-lobed optical mode has a low coupling efficiency to a single mode fiber, and is therefor typically not a preferred output from the laser 100. The multi-lobed optical mode can be converted to a single-lobed optical mode via coupling section 10. An example coupling section 10 that couples an optical mode from the active waveguide 4 to the passive waveguide 2 is a tapered coupler. Coupling section 10 comprises a taper where the optical mode is transferred from the active waveguide 4 to the passive waveguide 2. The taper can be a resonant coupled taper as shown in FIG. 2, or adiabatic in nature. Resonant coupled tapers are preferred as they are generally shorter in length than adiabatic coupled tapers. In the case of semiconductor optical amplifiers, as would be readily apparent to one skilled in the art, coupling sections adjacent to each end of the gain region could be implemented. The passive section 11 comprises a facet that reflects radiation resonantly coupled to the passive waveguide 2 so that the reflected radiation is coupled back to the active waveguide 4 through the taper. In the case of semiconductor optical amplifiers, as would be readily apparent to one skilled in the art, the passive section adjacent to the coupling section would comprise a facet that reflects little or no radiation back to the coupling section.

Figure 4:
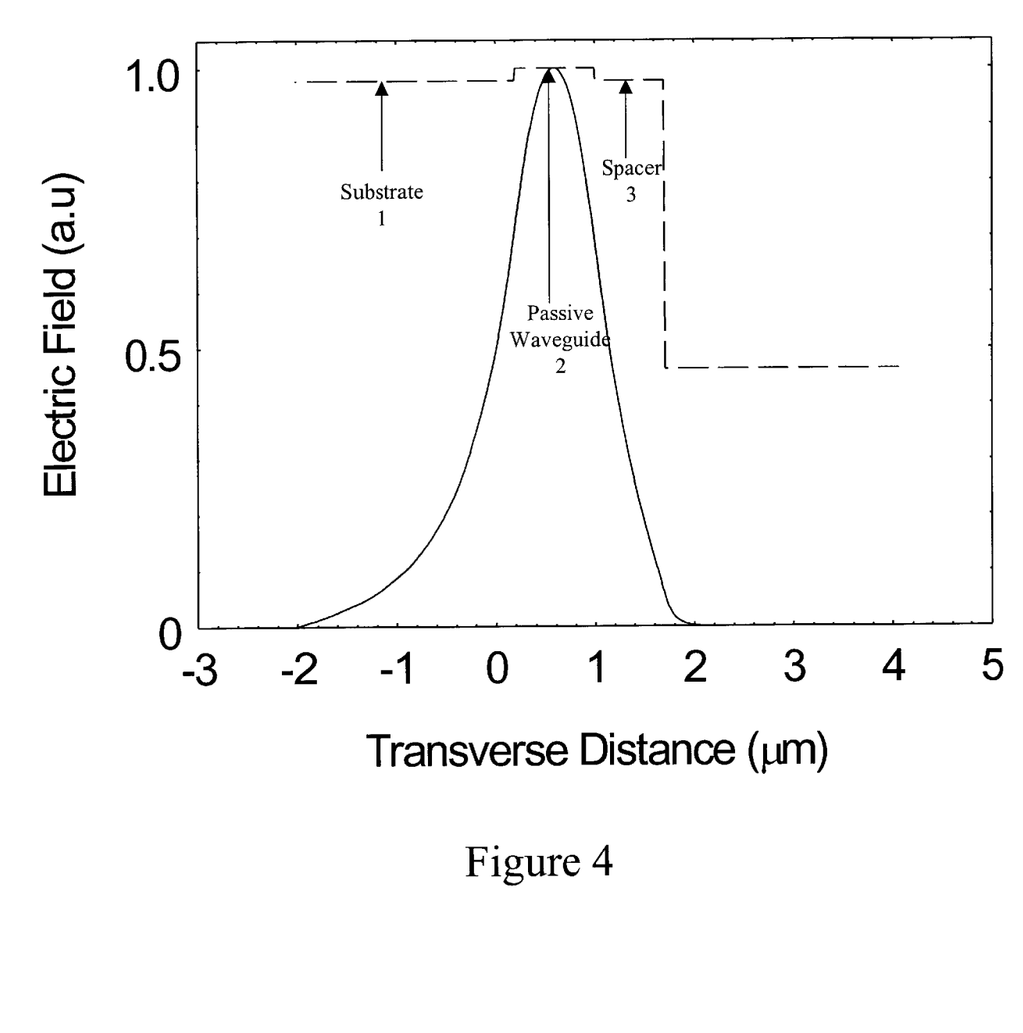
FIG. 4 is a graph of Electric Field v. Transverse Distance in a passive section of a semiconductor laser according to an embodiment of the present invention.

FIG. 2 shows a coupling section 10 that shifts the optical mode from the active waveguide 4 to the passive waveguide 2 and converts a multi-lobed optical mode to a single-lobed optical mode. Preferably, the coupling between the active waveguide and passive waveguide is accomplished with low optical loss. Preferably, the active waveguide 4 is coupled to the passive waveguide 2 such that the output of the laser 100 will be a diffraction-limited single-lobed substantially gaussian mode with a high coupling efficiency to a single mode fiber. FIG. 4 shows the electric field as a function of distance for such a diffraction-limited single-lobed substantially gaussian mode within the passive waveguide 2 in the passive section 11 of a particular device embodiment. The passive waveguide 2 should be of a dimension and index of refraction such that a single-lobed mode exists in the passive section 11 at the facet. As would be readily apparent to one skilled in the art, the term "dimension" is intended to describe the physical dimension of the passive waveguide 2. Thus, the present invention achieves improved loss characteristics while maintaining a highly-efficient single-lobed output mode.

Figure 5:
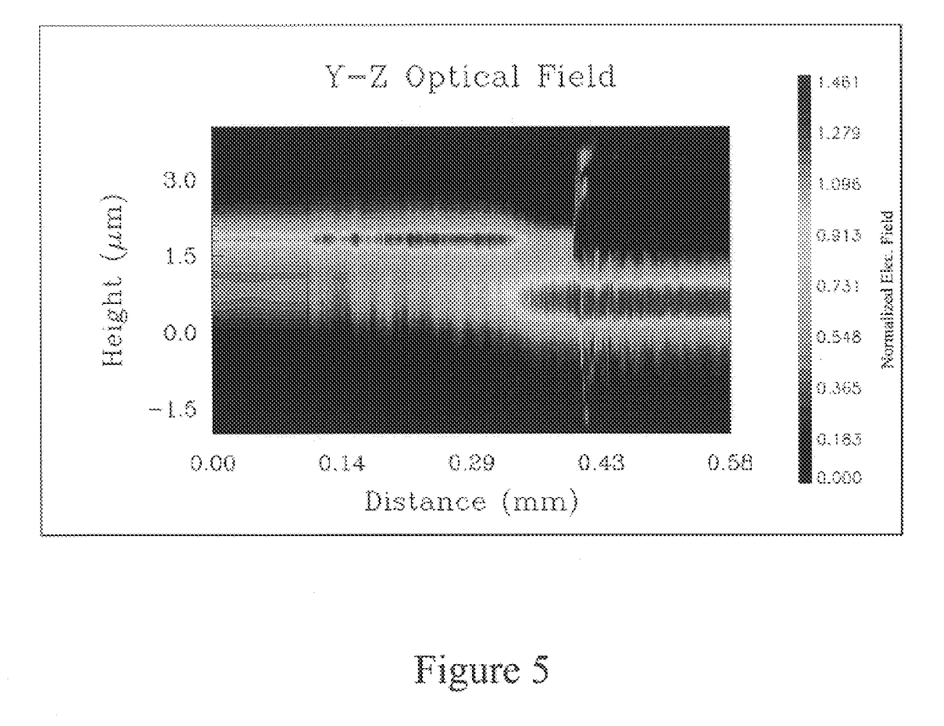
FIG. 5 is a beam propagation simulation showing the light or radiation intensity in the gain, coupling, and passive sections as radiation is coupled between the active waveguide and the passive waveguide in a semiconductor laser according to an embodiment of the present invention.
Figure 6:
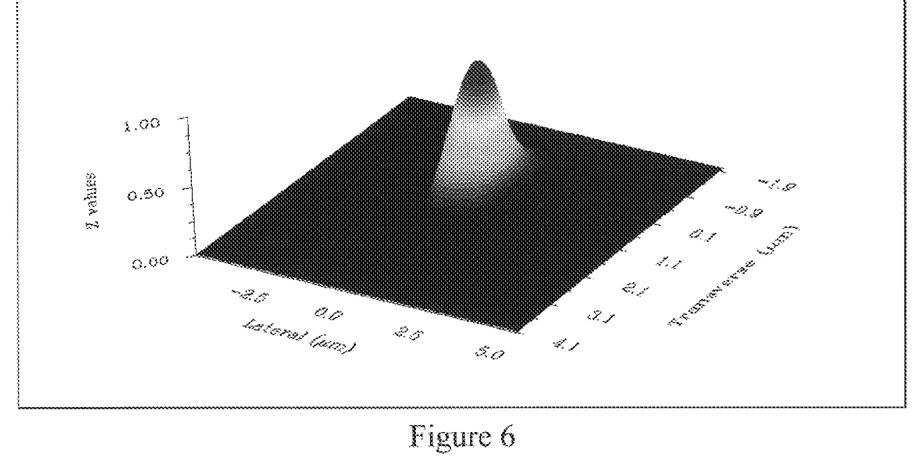
FIG. 6 is a graph showing a single lobed output of a semiconductor laser according to an embodiment of the present invention.

As shown in the beam propagation simulation of FIG. 5, coupling section 10 transfers the optical mode from the active waveguide 2, located between 1.7 μm and 2.0 μm on the vertical axis in FIG. 5, to the passive waveguide 4, located between 0.2 μm and 1.0 μm on the figure. For this simulation, a 200 μm long taper located between 0.1 mm and 0.3 mm on the bottom axis of FIG. 5 was used to couple the optical power from the active waveguide 4 to the passive waveguide 2. Approximately 95% of the optical mode was coupled between the active waveguide 4 and the passive waveguide 2. Further, a single lobed optical mode was observed at an output of the passive waveguide 2 as evidenced by the graph of FIG. 6.

In this first embodiment, the active waveguide 4 has been completely removed in section 11 as it is generally not required to stabilize the optical mode after being transferred between the active waveguide 4 and the passive waveguide 2 in the coupling section 10. Thus the optical mode is substantially confined within the passive waveguide 2 in the passive section 11.

Figure 7:
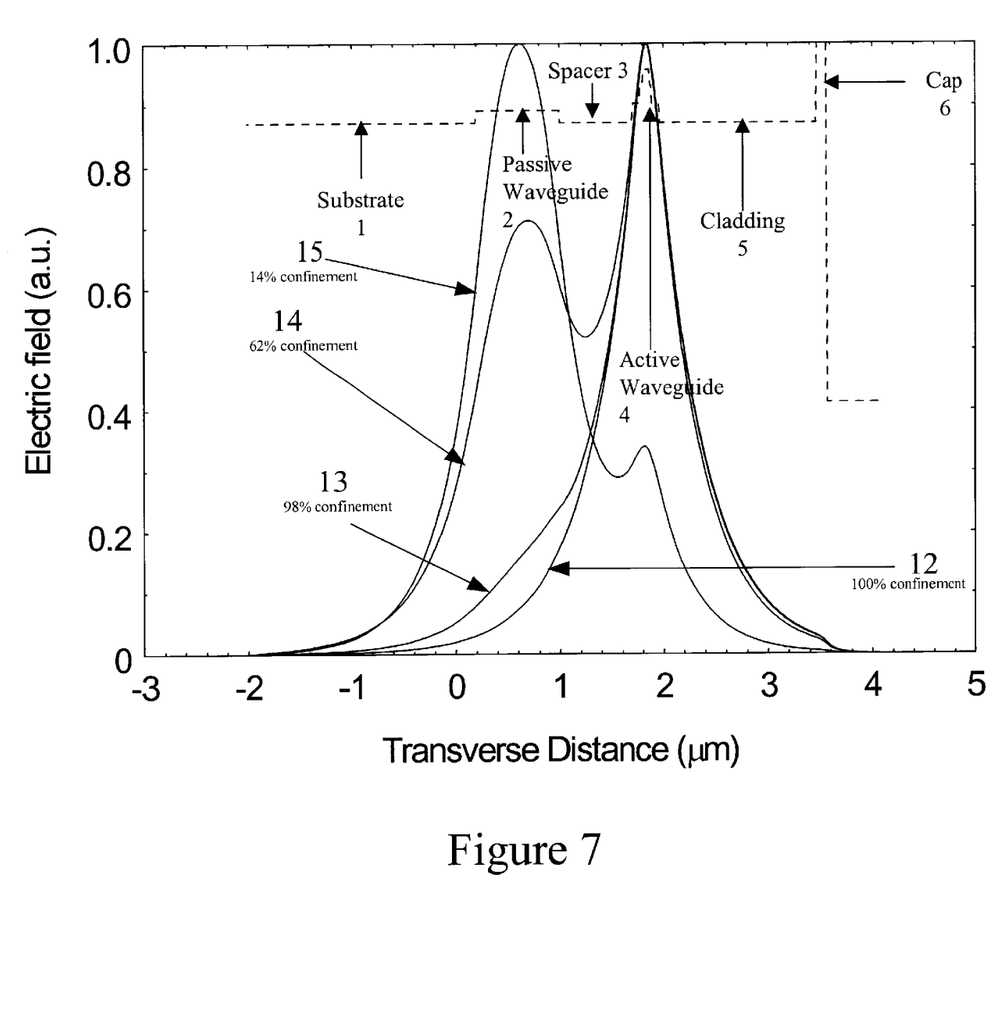
FIG. 7 is a graph showing the change in the electric field profile of the optical mode in the gain section for different passive waveguide parameters in a semiconductor laser according to an embodiment of the present invention.

The present invention allows customization of the laser 100 for a particular implementation by adjusting the properties of the passive waveguide 2. As shown in the graph of FIG. 7, line 12 shows a single lobe optical mode substantially only in the active waveguide 4, as is common for conventional lasers. As the index of refraction of the passive waveguide 2 is increased relative to the index of refraction of the active waveguide 4, progressively shown by lines 13, 14, and 15 respectively, the mode becomes two lobed. This decreases the confinement in the active waveguide 4 and shifts the optical mode to the passive waveguide 2, resulting in decreased internal absorption loss as previously described. Thus, the index of refraction of the passive waveguide 2 can be selected to achieve the desired confinement factor in the active waveguide 4

Figure 8:
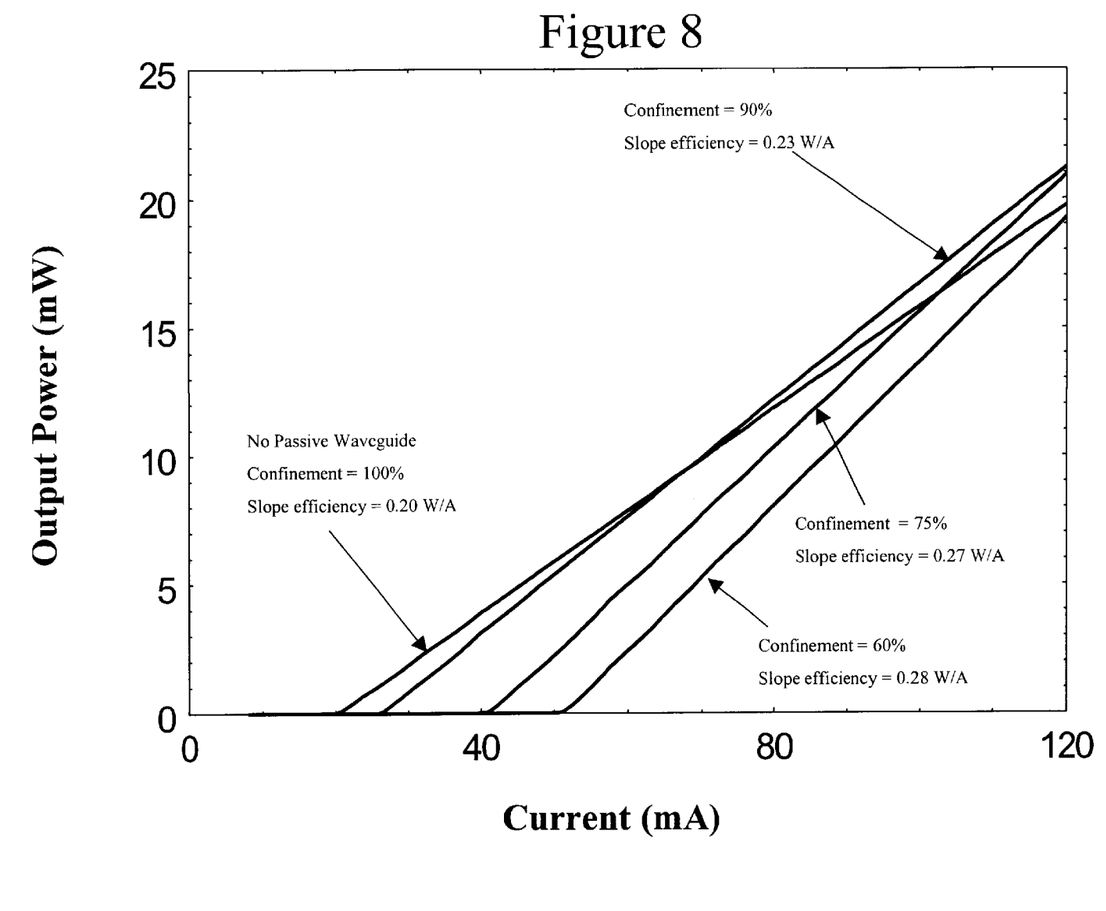
FIG. 8 is a graph showing Laser Output Power v. Current curves for various passive waveguide configurations in a semiconductor laser according to an embodiment of the present invention.

The present invention further allows higher output power as the laser 100 may be operated with higher slope efficiency. As shown in the graph of FIG. 8, semiconductor laser output power is charted versus current for various passive waveguide 2 configurations. As the index of the passive waveguide 2 is increased, the confinement in the active waveguide is reduced and the differential slope efficiency (change in power/change in current) of the laser 100 increases. The differential slope efficiency increase is at least partially attributable to the decreased internal absorption loss by reducing the confinement in the active waveguide 2, and by pushing the mode more into the passive waveguide 4 where the optical absorption losses are lower. Increased differential efficiency allows higher output power when the laser 100 is operated at high current far above threshold.

A preferred implementation as shown in FIG. 1 and FIG. 2, is further described in the following table:

| Layer | Material | Thickness(μm) | Type |
|---|---|---|---|
| Metal Contact | $Ga_{0.47}In_{0.53}As$ | 0.1 | p |
| Cladding | InP | 1.4 | p |
| Active waveguide | $Ga_{0.27}In_{0.73}As_{0.55}P_{0.45}$ | 0.05 | |
| Active waveguide | $Ga_{0.27}In_{0.73}As_{0.8}P_{0.2}$ | 0.01 | |
| Active waveguide | $Ga_{0.27}In_{0.73}As_{0.55}P_{0.45}$ | 0.01 | |
| Active waveguide | $Ga_{0.27}In_{0.73}As_{0.8}P_{0.2}$ | 0.01 | |
| Active waveguide | $Ga_{0.27}In_{0.73}As_{0.55}P_{0.45}$ | 0.01 | |
| Active waveguide | $Ga_{0.27}In_{0.73}As_{0.8}P_{0.2}$ | 0.01 | |
| Active waveguide | $Ga_{0.27}In_{0.73}As_{0.55}P_{0.45}$ | 0.05 | |
| Spacer | InP | 0.700 | n |
| Passive waveguide | $Ga_{0.27}In_{0.73}As_{0.32}P_{0.68}$ | 0.8 | n |
| Substrate | InP | 100 | n |

The index and the bandgap of the passive waveguide 2 can be optimized to obtain high power and low internal loss. The active waveguide 4 in this preferred embodiment is a three quantum well waveguide in a separate confinement heterostructure. The spacer 3 is composed of InP. The metal contact layer is preferably an ohmic contact for providing a good electrical contact to the metal layers of the laser 100.

Thus, an optical device comprising a gain section 9, a coupling section 10, and a passive section 11 has been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

What is claimed is:

1. An optical device comprising:
    a gain section adapted to emit radiation at a radiation wavelength;
    a coupling section adjacent to the gain section for transitioning radiation between an active waveguide and a passive waveguide; and
    a passive section adjacent to the coupling section supporting a single-lobed optical mode in said passive waveguide at the radiation wavelength,
    wherein said passive waveguide has an index of refraction and dimension such that the confinement of said radiation within said active waveguide in said gain section is reduced.

2. The optical device of claim 1, wherein the passive waveguide comprises a first material with a larger bandgap than a material of the active waveguide.

3. The optical device of claim 2, wherein the first material is an n-type material with a lower optical absorption at the radiation wavelength than a material of the active waveguide.

4. The optical device of claim 1, further comprising: a cladding layer parallel to the active waveguide on a side opposite the passive waveguide, the cladding layer having an optical absorption greater than an optical absorption of the passive waveguide at the radiation wavelength.

5. The optical device of claim 4, wherein the cladding layer is a p-type layer.

6. The optical device of claim 1, wherein the radiation in the gain section has a first lobe, and a second lobe.

7. The optical device of claim 6, wherein the peak intensity of the first lobe occurs within the active waveguide and the peak intensity of the second lobe occurs within the passive waveguide.

8. The optical device of claim 1, further comprising: a spacer layer between the active waveguide and the passive waveguide, the spacer layer having an index of refraction lower than the index of refraction of the active waveguide or the index of refraction of the passive waveguide.

9. The optical device of claim 1, wherein the coupling section includes a resonant taper, such that a resonant coupling condition is met between the active waveguide and the passive waveguide, the passive section comprising a facet that reflects radiation resonantly coupled to the passive waveguide so that the reflected radiation is resonantly coupled back to the active waveguide through the resonant taper.

10. The optical device of claim 1, wherein the coupling section includes an adiabatic taper, such that an adiabatic coupling condition is met between the active waveguide and the passive waveguide, the passive section comprising a facet that reflects radiation adiabatically coupled to the passive waveguide so that the reflected radiation is adiabatically coupled back to the active waveguide through the adiabatic taper.

11. The optical device of claim 1, wherein the coupling section includes a resonant taper, such that a resonant coupling condition is met between the active waveguide and the passive waveguide, the passive section comprising a facet that reflects little or no radiation resonantly coupled to the passive waveguide so that the little or no reflected radiation is resonantly coupled back to the active waveguide through the resonant taper.

12. The optical device of claim 1, wherein the coupling section includes an adiabatic taper, such that an adiabatic coupling condition is met between the active waveguide and the passive waveguide, the passive section comprising a facet that reflects little or no radiation adiabatically coupled to the passive waveguide so that little or no reflected radiation is adiabatically coupled back to the active waveguide through the adiabatic taper.

13. The optical device of claim 1, wherein the active waveguide comprises at least one of $Ga_xIn_{(1-x)}As_yP_{(1-y)}$ and $Al_yGa_xIn_{(1-x-y)}As$.

14. The optical device of claim 1, wherein the passive waveguide comprises at least one of $Ga_xIn_{(1-x)}As_yP_{(1-y)}$ and $Al_yGa_xIn_{(1-x-y)}As$.

15. The optical device of claim 1, wherein the optical device comprises one of a laser, a light emitting diode (LED), and a semiconductor optical amplifier.

16. The optical device of claim 1, further comprising: a metal layer positioned parallel to the active waveguide on a side opposite the passive waveguide, and a metal layer positioned parallel to the passive waveguide on a side opposite the active waveguide.

17. The optical device of claim 1, wherein radiation in the gain section is substantially confined to the active waveguide.

18. The optical device of claim 1, wherein radiation in the gain section is substantially confined to the passive waveguide.

19. A method of generating optical radiation comprising the steps of:
    generating a multi-lobed lasing mode in a gain section, one lobe of the lasing mode being substantially in an active waveguide in said gain section; and
    coupling the multi-lobed lasing mode to a single lobed optical mode substantially in a passive waveguide,
    wherein said passive waveguide has an index of refraction and dimension such that the confinement of said multi-lobed lasing mode within said active waveguide in said gain section is reduced.

20. The method of claim 19, wherein the passive waveguide has an index of refraction and dimension such that the single lobed optical mode in a passive section of the passive waveguide is a substantially diffraction-limited single-lobed gaussian mode.

21. The method of claim 19, further comprising the step of: coupling the single lobed optical mode to an optical fiber.

22. The method of claim 21, wherein the optical fiber is a single mode optical fiber.

23. The method of claim 19, wherein the active waveguide comprises at least one of $Ga_xIn_{(1-x)}As_yP_{(1-y)}$ and $Al_yGa_xIn_{(1-x-y)}As$.

24. The method of claim 19, wherein the passive waveguide comprises an n-doped material with a larger bandgap than a material of the active waveguide.

25. The method of claim 19, wherein the active waveguide comprises at least one of $Ga_xIn_{(1-x)}As_yP_{(1-y)}$ and $Al_yGa_xIn_{(1-x-y)}As$.

26. An optical device comprising:
    a gain section adapted to emit radiation at a radiation wavelength within an active waveguide, the gain section adapted for supporting a multi-lobed optical mode comprising a first and second lobe at the radiation wavelength;
    a coupling section adjacent to the gain section for transitioning said radiation from said active waveguide to an n-doped passive waveguide; and a passive section adjacent to the coupling section for supporting a single-lobed optical mode in said n-doped passive waveguide, wherein the passive waveguide has an index of refraction and dimension such that confinement of the multi-lobed optical mode at the radiation wavelength within said active waveguide in said gain section is reduced, and wherein the peak intensity of the first lobe in the gain section occurs within said active waveguide and the peak intensity of the second lobe in the gain section occurs within said passive waveguide.

27. The optical device of claim 26, further comprising: a spacer layer between the active waveguide and the passive waveguide, the spacer layer having an index of refraction lower than the index of refraction of the active waveguide or the index of refraction of the passive waveguide.

28. The optical device of claim 26, wherein the coupling section includes a resonant taper, such that a resonant coupling condition is met between the active waveguide and the passive waveguide, and wherein the passive section includes a facet that reflects radiation resonantly coupled to the passive waveguide so that the reflected radiation is resonantly coupled back to the active waveguide through the resonant taper.

29. The optical device of claim 26, wherein the coupling section includes an adiabatic taper, such that an adiabatic coupling condition is met between the active waveguide and the passive waveguide, the passive section comprising a facet that reflects radiation adiabatically coupled to the passive waveguide so that the reflected radiation is adiabatically coupled back to the active waveguide through the adiabatic taper.

30. The optical device of claim 26, wherein the coupling section includes a resonant taper, such that a resonant coupling condition is met between the active waveguide and the passive waveguide, the passive section comprising a facet that reflects little or no radiation resonantly coupled to the passive waveguide so that the little or no reflected radiation is resonantly coupled back to the active waveguide through the resonant taper.

31. The optical device of claim 26, wherein the coupling section includes an adiabatic taper, such that an adiabatic coupling condition is met between the active waveguide and the passive waveguide, the passive section comprising a facet that reflects little or no radiation adiabatically coupled to the passive waveguide so that little or no reflected radiation is adiabatically coupled back to the active waveguide through the adiabatic taper.

32. The optical device of claim 26, wherein the active waveguide comprises at least one of $Ga_xIn_{(1-x)}As_yP_{(1-y)}$ and $Al_yGa_xIn_{(1-x-y)}As$.

33. The optical device of claim 26, wherein the passive waveguide comprises at least one of $Ga_xIn_{(1-x)}As_yP_{(1-y)}$ and $Al_yGa_xIn_{(1-x-y)}As$.

34. The optical device of claim 26, wherein the optical device comprises one of a laser, a light emitting diode (LED), and a semiconductor optical amplifier.

35. The optical device of claim 26, further comprising: metal layer positioned parallel to the active waveguide on a side opposite the passive waveguide, and a metal layer positioned parallel to the passive waveguide on a side opposite the active waveguide.

* * * * *